United States Patent
Wu et al.

(10) Patent No.: US 11,411,048 B2
(45) Date of Patent: Aug. 9, 2022

(54) MAGNETORESISTIVE RANDOM-ACCESS MEMORY DEVICE STRUCTURE

(71) Applicant: International Business Machines Corporation, Armonk, NY (US)

(72) Inventors: Heng Wu, Guilderland, NY (US); Alexander Reznicek, Troy, NY (US); Ruilong Xie, Niskayuna, NY (US); Julien Frougier, Albany, NY (US); Chen Zhang, Albany, NY (US); Bruce B. Doris, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 113 days.

(21) Appl. No.: 16/797,423

(22) Filed: Feb. 21, 2020

(65) Prior Publication Data
US 2021/0265422 A1   Aug. 26, 2021

(51) Int. Cl.
| | |
|---|---|
| *H01L 27/22* | (2006.01) |
| *H01L 29/786* | (2006.01) |
| *H01L 43/12* | (2006.01) |
| *H01L 29/66* | (2006.01) |
| *H01L 43/02* | (2006.01) |

(52) U.S. Cl.
CPC ...... *H01L 27/228* (2013.01); *H01L 29/66666* (2013.01); *H01L 29/78642* (2013.01); *H01L 43/02* (2013.01); *H01L 43/12* (2013.01)

(58) Field of Classification Search
CPC ............ H01L 27/228; H01L 29/66666; H01L 29/78642
See application file for complete search history.

(56) References Cited

U.S. PATENT DOCUMENTS

| | | | |
|---|---|---|---|
| 8,804,414 B2 | 8/2014 | Kramer | |
| 9,142,278 B2 | 9/2015 | Zhu | |
| 9,478,638 B2 | 10/2016 | Yang | |
| 9,496,033 B2 | 11/2016 | Chung | |
| 9,520,501 B2 | 12/2016 | Koldiaev | |
| 9,691,819 B2 | 6/2017 | Oh | |
| 9,853,053 B2 | 12/2017 | Lupino | |
| 10,283,565 B1 | 5/2019 | Peng | |
| 10,319,785 B2 | 6/2019 | Yokoyama | |
| 10,446,606 B2 | 10/2019 | Kumar | |
| 2014/0016394 A1 | 1/2014 | Chung | |
| 2015/0243707 A1 | 8/2015 | Park | |
| 2015/0357015 A1 | 12/2015 | Kent | |
| 2019/0027535 A1* | 1/2019 | Kumar | H01L 27/228 |

(Continued)

FOREIGN PATENT DOCUMENTS

| | | | | |
|---|---|---|---|---|
| EP | 0627761 A2 * | 12/1994 | ....... | H01L 21/02433 |
| JP | 2014220376 A | 11/2014 | | |

OTHER PUBLICATIONS

Choday et al., "Write-Optimized STT-MRAM Bit-Cells Using Asymmetrically Doped Transistors", IEEE Electron Device Letters, vol. 35, No. 11, Nov. 2014, pp. 1100-1102.

(Continued)

*Primary Examiner* — Errol V Fernandes
(74) *Attorney, Agent, or Firm* — David K. Mattheis; Maeve Carpenter

(57) ABSTRACT

A semiconductor device including an MRAM (magnetoresistive random-access memory) cell disposed above and in electrical contact with a VFET (vertical field effect transistor) access transistor.

17 Claims, 20 Drawing Sheets

(56) References Cited

U.S. PATENT DOCUMENTS

2019/0206935 A1 7/2019 Kim
2020/0264954 A1* 8/2020 Belgaied ............ G06F 11/1076

OTHER PUBLICATIONS

Shafaei et al., Low Write-Energy STT-MRAMs using FinFET-based Access Transistors, . In 2014 IEEE 32nd International Conference on Computer Design (ICCD), Oct. 2014, pp. 374-379, Copyright 2014 IEEE.
Shamsi et al., "Reliable and High Performance STT-MRAM Architectures based on Controllable-Polarity Devices", 2015 33rd IEEE International Conference on Computer Design (ICCD), Oct. 2015, pp. 343-350, Copyright 2015 IEEE.

* cited by examiner

MAGNETORESISTIVE RANDOM-ACCESS MEMORY DEVICE STRUCTURE

BACKGROUND

The disclosure relates generally to structures and methods of fabrication for devices including magnetoresistive random-access memory (MRAM). The disclosure relates particularly to structures and methods of fabrication for devices including MRAM (magnetoresistive random-access memory) coupled to vertical field effect access transistors (VFET).

MRAM cells exploit the quantum mechanical effect of electron tunneling through an insulating layer disposed between two ferromagnetic layers, a free layer and a reference layer. The tunnel magnetoresistance (TMR) of the MRAM cell can be switched between a first state of low resistance where the two ferromagnetic layers have parallel magnetic dipole moments, and a second state of high resistance, where the two ferromagnetic layers have antiparallel magnetic dipole moments. Switching the free layer magnetic dipole moment is accomplished by altering the magnetic dipole moment of the free ferromagnetic layer of the MRAM cell. The alteration occurs when a write current is passed through the MRAM cell stack. Write currents are asymmetrical, the write current to switch from antiparallel to parallel (AP-P) is not equal to the write current to switch from parallel to antiparallel (P-AP). The two write current also run in opposing directions through the MRAM cells and their associated access transistors.

The absolute and relative magnitudes of the two resistances and two write currents depend upon the configuration of the cell stack. For a standard connected MRAM cell stack—bottom electrode, reference layer, tunnel barrier layer, free layer upper electrode—the AP -P write current is greater than P-AP write current as the P state has the high source degenerating resistance. For a reverse connected MRAM cell stack—bottom electrode, free layer, tunnel barrier layer, reference layer, upper electrode—the P-AP write current is greater as the AP state has the high source degenerating resistance.

For a standard connected MRAM cell stack the TMR can be calculated as the AP state resistance minus the parallel state resistance, divided by the parallel state resistance plus any circuit parasitic series resistances. Parasitic series resistances arise from the circuit elements disposed between the MRAM cell stack and the its associated access transistor. The resistance increases with the distance between the MRAM cell stack and the transistor due to increasing amount of material through which the write currents must pass. In reading an MRAM cell, a known voltage is applied to the cell and the current through the cell is detected. Each of the AP and P states results in a different current. The greater the TMR, the greater the difference between the two read currents and higher the degree of sensing performance for the MRAM cell.

Typical MRAM cells may be disposed between the second, M2, and third, M3 layers of the device, and away from the associated access transistor, increasing parasitic series resistance and reducing TMR. Typically, the associated access transistor has a substantially different design footprint that the MRAM cell making the two elements physically incompatible and necessitating the distance between the elements to configure the connection between them. Typically, the AP-P write current of the access transistor is higher than the P-AP write current due to asymmetric device electrical resistances which vary according to current direction. High write currents, and the associated high power levels, reduce device reliability and lifecycle due to MRAM dielectric material degradation.

VFETs have source and drain regions which are independently epitaxially grown. This independence enables the source and drain regions to be grown with geometric and/or doping asymmetries. Geometric and/or doping asymmetries yield transistors having electrical conductivity and associated current levels which vary with direction of the applied bias voltage.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a semiconductor device including an MRAM cell disposed above and in electrical contact with a VFET access transistor.

In one aspect, a semiconductor device including a VFET, a MRAM cell disposed above and in electrical communication with the VFET, and an upper VFET electrode, in electrical communication with the MRAM. The upper VFET electrode has a horizontal critical dimension less than a horizontal critical of the MRAM.

In one aspect, a method of fabricating a semiconductor device, the method including fabricating a VFET as part of a device, fabricating an MRAM above and in electrical contact with the VFET.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

Each of the figures provides a front and side view of a device at an intermediate fabrication stage. The side view is taken along section line z-z of the front view.

DETAILED DESCRIPTION

Figure 1:
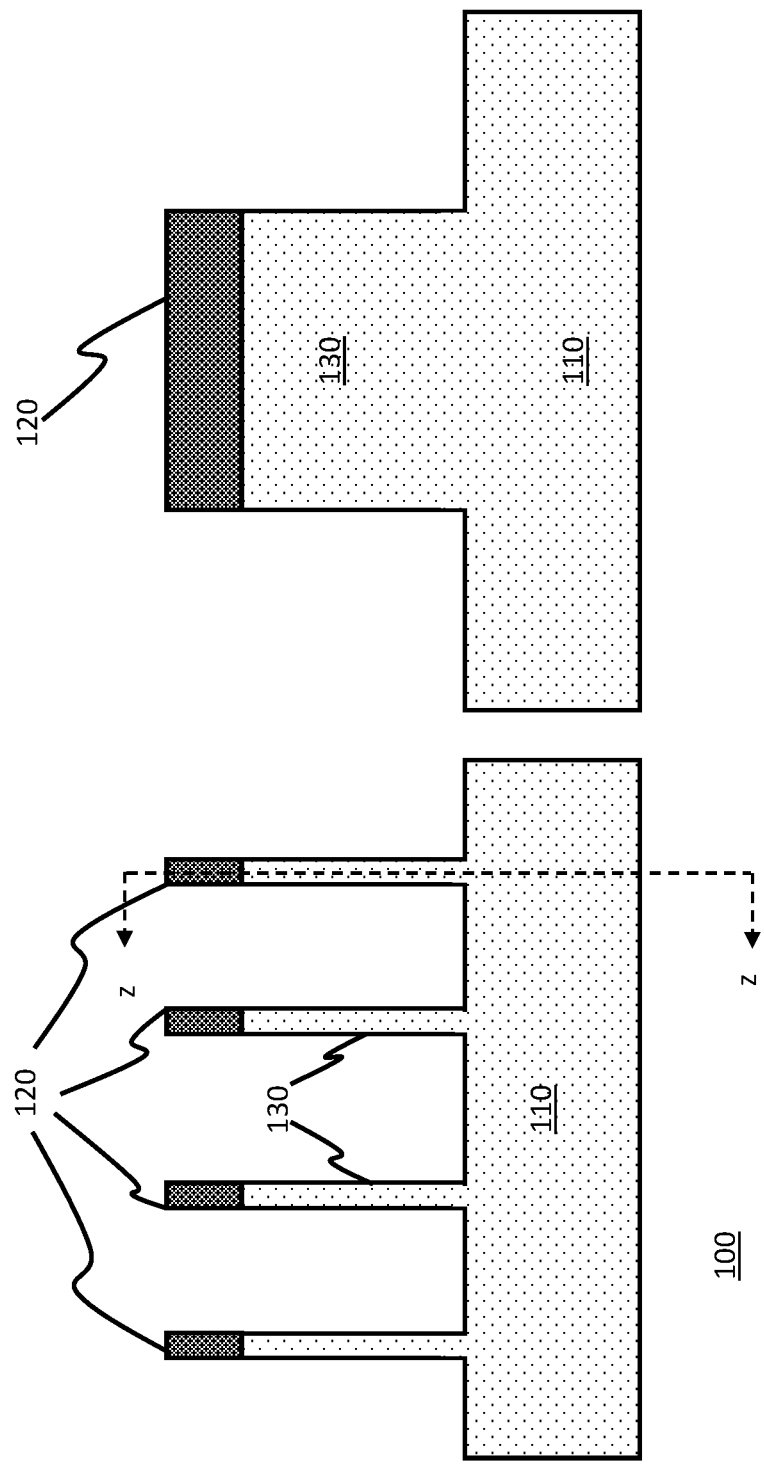
FIG. 1 provides a cross-sectional view of a step in the fabrication of a semiconductor device, according to an embodiment of the invention. The figure illustrates device fins etched upon a crystalline Si substrate.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Ideally the TMR of the MRAM, access transistor, pair is large to enhance the sensing performance of the MRAM cell—the ability to differentiate between the AP and P states (between "0" and "1"). Reducing parasitic series resistance by forming MRAM cell stacks closer to access transistors reduces the TMR lowering effects of parasitic series resistance. As the AP-P and P-AP write currents pass through the MRAM cell and access transistor in opposing directions, providing access transistors having electrical conductivities which vary according to the direction of the applied voltage, reduces high current and power levels when switching a standard connection MRAM cell from P-AP states. The disclosed invention embodiments provide device structures and associated structure fabrication methods for devices having MRAM cells closely coupled to access transistors. The disclosed embodiments further provide devices having vertical access transistors including source and drain regions tailored to reduce the high current and power effects associated with switching the MRAM cells from a high resistance state to a low resistance state.

VFETs include upper and lower epitaxially grown source-drain (SD) regions. The respective upper and lower SD regions are formed by different steps during device fabrication and are located in different parts of the device, enabling the respective upper and lower SD regions to be formed with geometric and/or doping asymmetries. Geometric asymmetry refers to SD regions having different shapes and volumes as well as differing degrees of fin overlap. Doping asymmetries refers to SD regions having differing levels of positive or negative dopants altering the electrical characteristics of the base semiconductor material of the region.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

In the present embodiments, the SD regions may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

Reference is now made to the figures. The figures provide schematic cross-sectional illustration of semiconductor devices at intermediate stages of fabrication, according to one or more embodiments of the invention. The figures provide a front cross-section and a side cross-section taken along section line z-z of the front cross-section. The figures provide schematic representations of the devices of the invention and are not to be considered accurate or limiting with regards to device element scale.

FIG. 1 illustrates the device 100 after the epitaxially growth of a crystalline substrate 110, the deposition of a hard mask 120 upon the crystalline substrate, and the subsequent masking and selective etching of the hard mask and underlying crystalline substrate to form a set of fins 130 upon the substrate. The fins are composed of the same material as the underlying substrate. In an embodiment, fins 130 have a critical dimension, or width, ranging between about 4 nm and about 10 nm. Fins 130 have a height ranging between about 40 nm and about 100 nm. In an embodiment, the fins 130 are separated by spaces of about 40 nm. The semiconductor substrate 110 may include any semiconductor material including, for example, silicon.

The term "semiconductor material" is used throughout the present application to denote a material that has semiconducting properties. Besides silicon, the semiconductor material may be strained Si, silicon carbide (SiC), germanium (Ge), silicon germanium (SiGe), silicon-germanium-carbon (SiGeC), Si alloys, Ge alloys, III-V semiconductor materials (e.g., gallium arsenide (GaAs), indium arsenide (InAs), indium phosphide (InP), or aluminum arsenide (AlAs)), II-VI materials (e.g., cadmium selenide (CaSe), cadmium sulfide (CaS), cadmium telluride (CaTe), zinc oxide (ZnO), zinc selenide (ZnSe), zinc sulfide (ZnS), or zinc telluride (ZnTe), or any combination thereof. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements.

Hard mask 120 includes a nitride, oxide, an oxide-nitride bilayer, or another suitable material. In some embodiments, the hard mask 120 may include an oxide such as silicon oxide (SiO), a nitride such as silicon nitride (SiN), an oxynitride such as silicon oxynitride (SiON), combinations thereof, etc. In some embodiments, the hard mask 120 is a silicon nitride such as $Si_3N_4$. In an embodiment, hard mask 120 consists of a layer having a thickness of between about 20 nm and about 150 nm.

Etching of the substrate to yield the fins can be performed using a timed anisotropic etch such as reactive ion etching (RIE). The etch can be performed in a single etch that removes material from hard mask 120 and semiconductor layer 110 in a single process step, or as multiple material specific etching steps.

Figure 2:
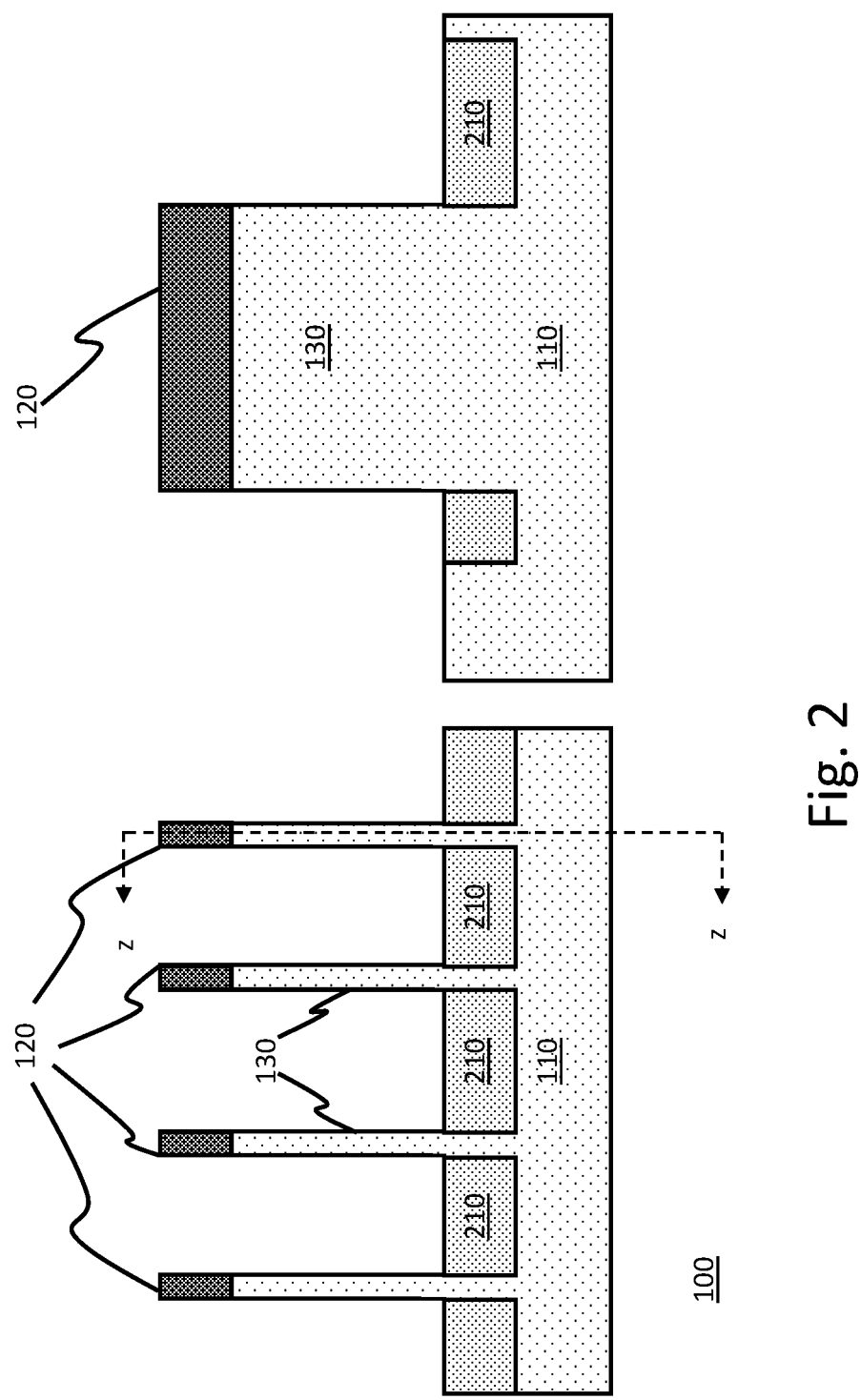
FIG. 2 provides a cross-sectional view of a step in the fabrication of a semiconductor device, according to an embodiment of the invention. The figure illustrates the device after the etching of lower device source-drain region trenches and the subsequent epitaxial growth of device source-drain regions.

FIG. 2 illustrates device 100 after the removal of crystalline material making way for the epitaxial growth of the lower SD regions 210 of the VFET. Trenches (not shown) are etched in the substrate 110 adjacent to the bases of fins 130. In an embodiment, the trenches are between about 10 nm and about 30 nm deep. In an embodiment, anisotropic etching, such as RIE, selectively removes material from device horizontal surfaces to the desired trench depth. Adjustment of the SD region depth, and associated lower SD region fin overlap, together with the lower SD region 210 dopant concentration relative to the upper VFET SD region, enables the creation of relative junction performance (forward or reverse current bias) for the VFET. Doped semiconductor material is then epitaxially grown to form the VFET lower SD regions 210 in the trenches as described above.

Figure 3:
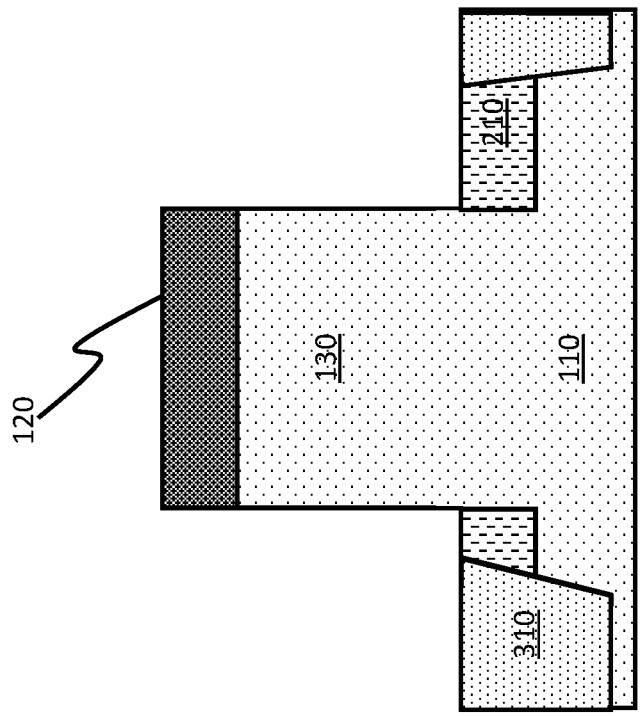
FIG. 3 provides a cross-sectional view of a step in the fabrication of a semiconductor device, according to an embodiment of the invention. The figure illustrates the device after the formation of shallow trench isolation regions between respective device circuit elements.
Figure 3:
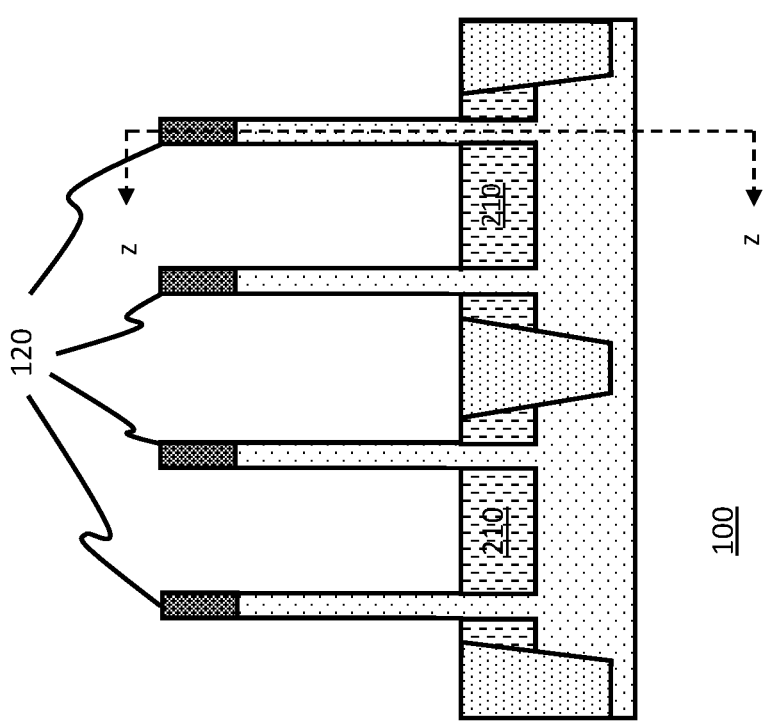

FIG. 3 illustrates device 100 after the formation of shallow trench isolation (STI) regions 310 between fin-based circuit elements of the device. The STI regions 310 can be formed by, any suitable process including, for example, lithography or etching to form trenches, and then filling the trenches with an insulating material, such as silicon dioxide, followed by oxide recess process to trim the upper surface of STI regions 310 to the level of the device lower SD regions 210 and the underlying substrate 110, and by chemical mechanical planarization (CMP) to smooth the upper surface of STI regions 310. The STI regions 310 provide isolation between device elements formed upon neighboring fins 130.

Figure 4:
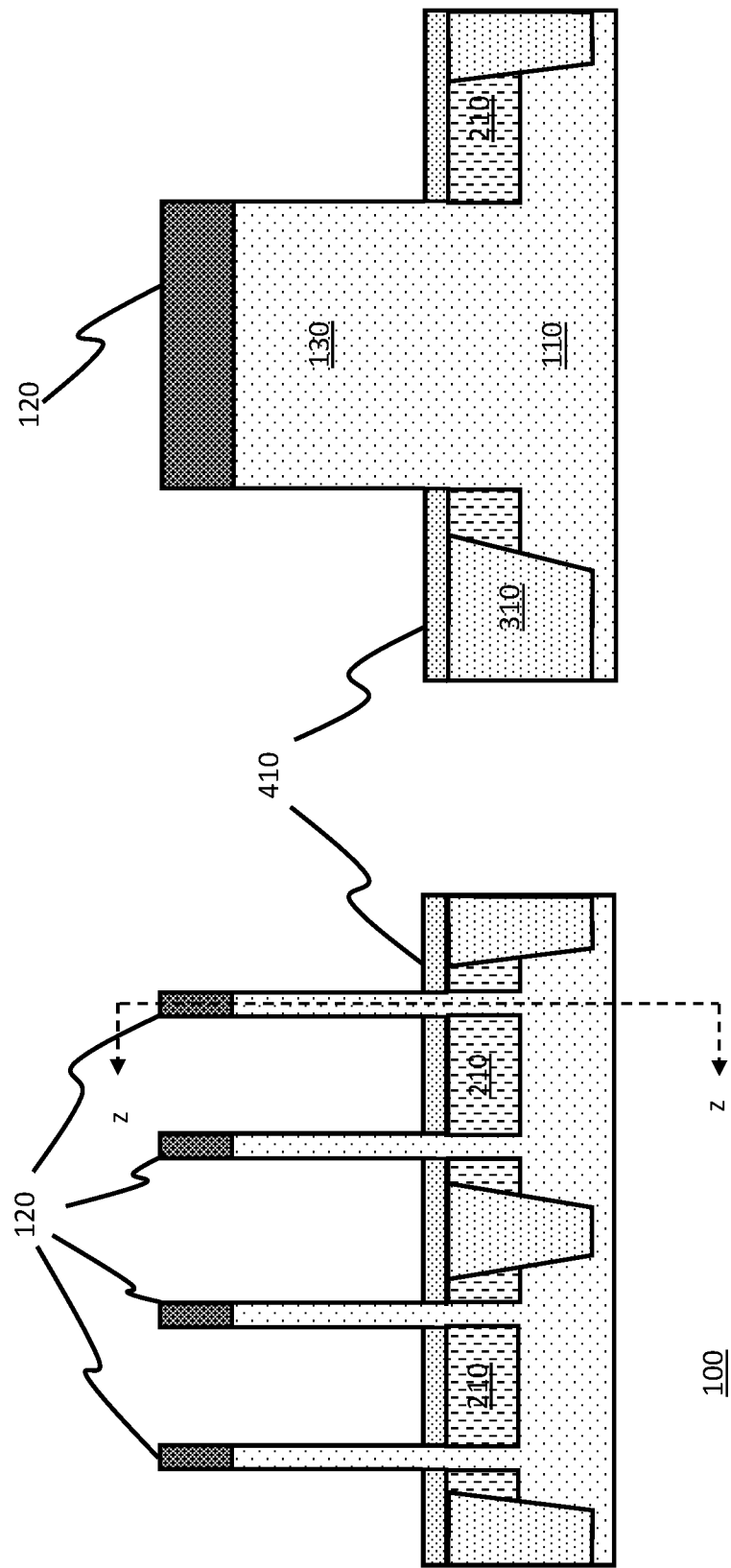
FIG. 4 provides a cross-sectional view, of a step in the fabrication of a semiconductor device, according to an embodiment of the invention. The figure illustrates the device after the deposition of a bottom spacer layer.

FIG. 4 illustrates the device after the deposition of bottom spacer 410. The bottom spacer 410 includes, dielectric material(s). Bottom spacer 410 can be a dielectric material having a dielectric constant greater than 3.9, 7.0, or 10.0. Non-limiting examples of suitable materials for the gate dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The bottom spacer 410 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the bottom spacer 410 dielectric material may vary depending on the deposition process as well as the composition and number of high-k dielectric materials used. In an embodiment, the bottom spacer final thickness ranges from between about 3 nm to about 10 nm. After the deposition processes is completed, bottom spacer layer material present upon fin 130 vertical surfaces is etched away. In an embodiment, area specific deposition yields bottom spacer 410 deposited upon the horizontal surfaces of device 100. The design of bottom spacer 410 and lower VFET SD region 210 affects the forward and reverse current asymmetries of the VFET. Increasing or decreasing the overlap of lower VFET SD regions 210 and fins 130, with an accompanying decrease or increase in bottom spacer 410 thickness, relative to the upper VFET SD regions alters the VFET MRAM write "0", write "1", current asymmetry of the device. Decreasing the overlap of the lower VFET region while increasing the overlap of the upper VFET SD region yields a VFET device having smaller forward and larger reverse currents.

Figure 5:
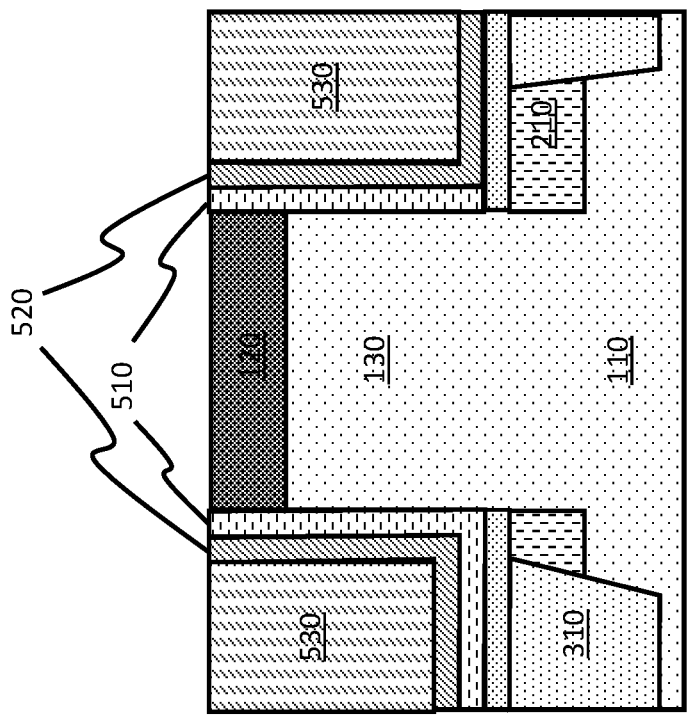
FIG. 5 provides a cross-sectional view of a step in the fabrication of a semiconductor device, according to an embodiment of the invention. The figure illustrates the device after the deposition of gate stack layers.
Figure 5:
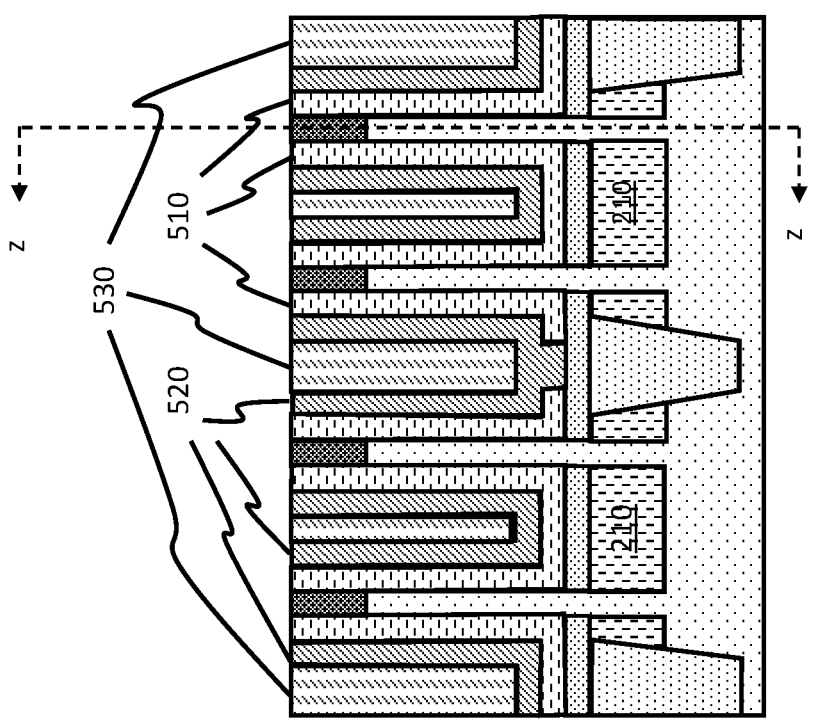

FIG. 5 illustrates the device after the formation of transistor gate stacks including work function metal 510, protective dielectric 520 and encapsulating interlayer dielectric 530 successively disposed over bottom spacer 410. Work function metal 510 may be disposed over the bottom spacer 410. The type of work function metal(s) 510, depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) 510 may be deposited by processes which include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

After work function metal 510 deposition, a protective dielectric material 520, such as SiN, is disposed upon work function metal 510. The protective dielectric material 520 layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the protective dielectric material 520 may vary between about 3 nm and about 10 nm, depending on the deposition process as well as the composition and number of high-k dielectric materials used.

Deposition of an interlayer dielectric (ILD) layer 530 follows the protective dielectric material 520. ILD layer 530, includes a dielectric material such as silicon oxide, silicon nitride, silicon oxynitride, or a combination thereof. Alternatively, ILD layer 530, may include a low-k dielectric material having a dielectric constant less than 3.9 (e.g., the dielectric constant of silicon oxide), and more specifically less than 2.5. Exemplary low-k dielectric materials include organosilicate glass (OSG) and SiLK®. ILD layer 530, is planarized to a common upper surface with protective dielectric material 520, work function metal 510 and hard mask 120.

Figure 6:
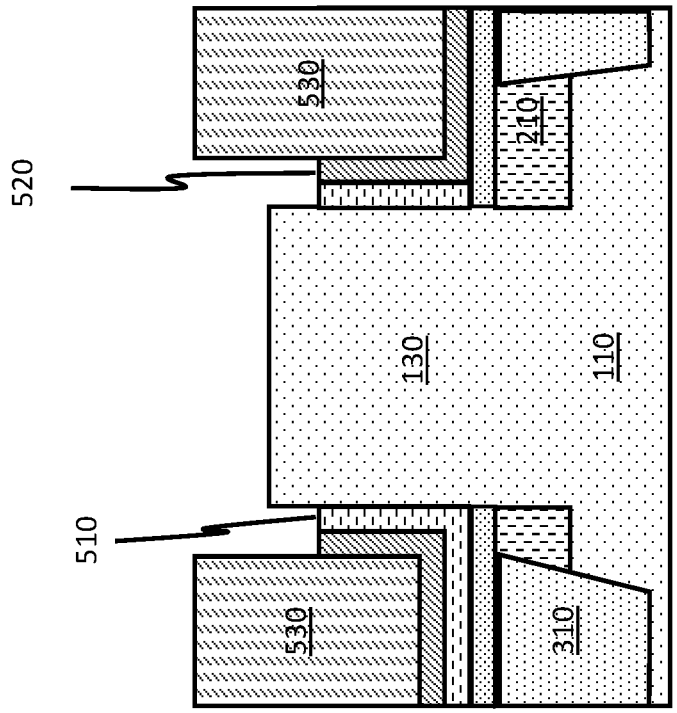
FIG. 6 provides a cross-sectional view of a step in the fabrication of a semiconductor device, according to an embodiment of the invention. The figure illustrates the device after the etching away of device hard mask layer and the trimming back of the gate stack layers.
Figure 6:
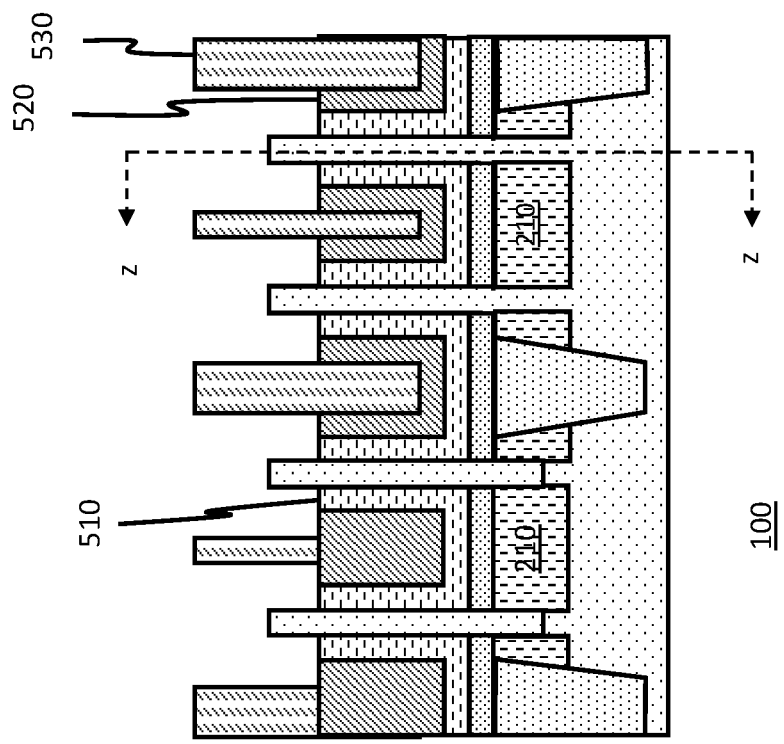

FIG. 6 illustrate device 100 after selective etching of materials in preparation of upper spacer and upper VFET SD region formation. As shown in the figure, portions of protective dielectric material 520, work function metal 510, and hard mask 120 are selectively etched away exposing upper portions of fins 130. Single or multistage RIE may be utilized to remove the hard mask 120, work function metal 510, and protective dielectric material 520. Varying the depth of the etching enables adjustment of the geometry and volume of the upper VFET junction including the upper spacer and upper VFET SD regions as described below, and the adjustment of the relative upper/lower junction performance.

Figure 7:
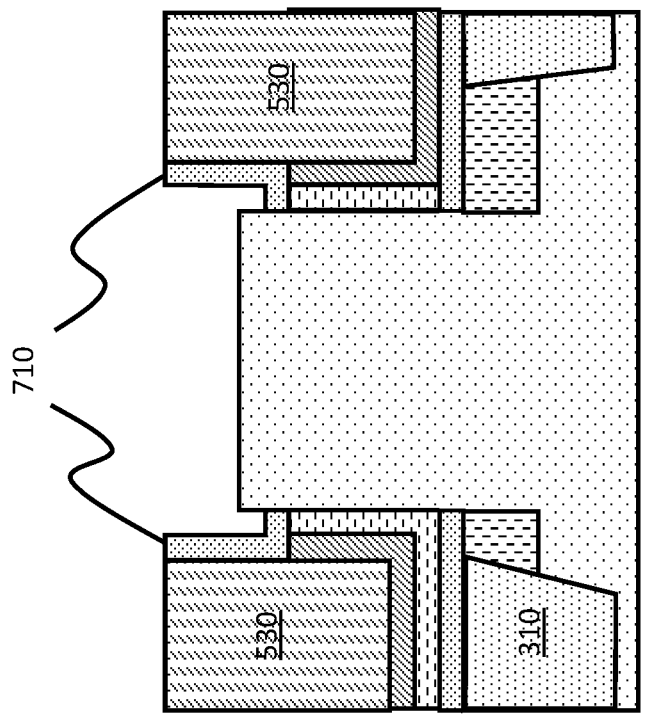
FIG. 7 provides a cross-sectional view of a step in the fabrication of a semiconductor device, according to an embodiment of the invention. The figure illustrates the device after the deposition of a top spacer layer.
Figure 7:
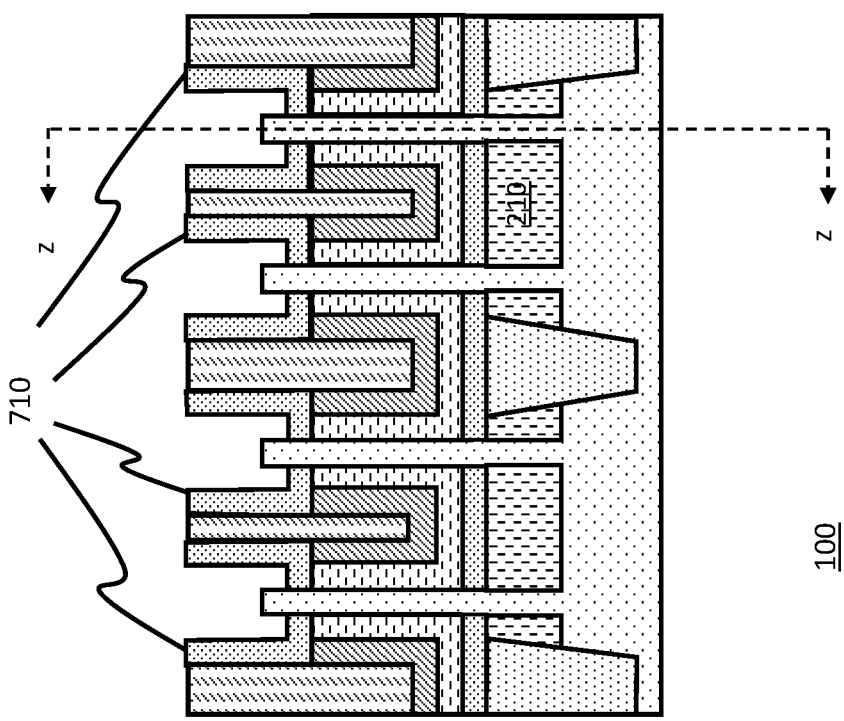

FIG. 7 illustrates device 100 after formation of upper spacer 710. The upper spacer 710 includes, dielectric material(s). Upper spacer 710 can be a dielectric material having a dielectric constant greater than 3.9, 7.0, or 10.0. Non-limiting examples of suitable materials for the gate dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The upper spacer 710 layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the upper spacer 710 dielectric material may vary depending on the deposition process as well as the composition and number of high-k dielectric materials used. After the deposition processes is completed, upper spacer layer material present upon fin 130 vertical surfaces is etched away. In an embodiment, area specific deposition yields upper spacer layer 710, having a thickness range of between about 3 nm and about 10 nm, deposited upon the horizontal surfaces of device 100. The design of upper spacer 710 affects the extent of overlap of the upper VFET SD region and the electrical properties of the VFET in terms of forward and reverse currents.

Figure 8:
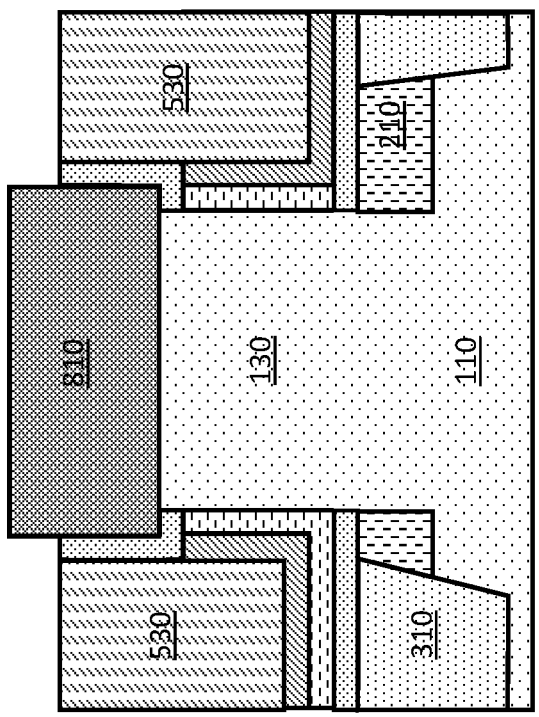
FIG. 8 provides a cross-sectional view of a step in the fabrication of a semiconductor device, according to an embodiment of the invention. The figure illustrates the device after the epitaxial growth of upper device source-drain regions.
Figure 8:
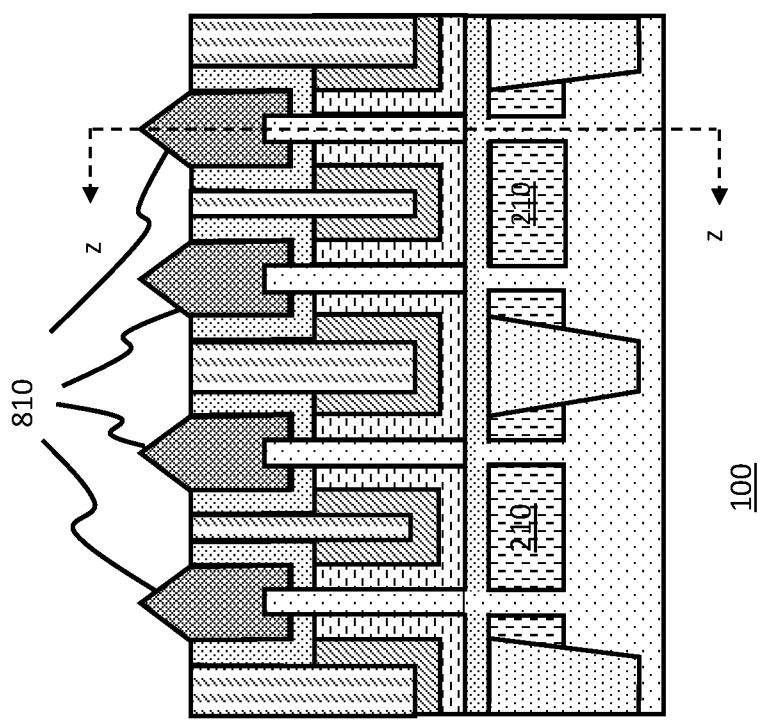

FIG. 8 illustrates device 100 after epitaxial growth of upper VFET SD regions 810. Epitaxial growth of the upper VFET SD regions 810 proceeds from the upper portion of the fins 130. Similar to the lower SD region, selection of the dopant and doping concentration of the upper SD regions, in conjunction with the SD region 810 geometry and upper spacer 710 configuration, enables tailoring the relative electrical properties of the upper and lower SD regions, and the performance of the VFET to operating voltages. The details regarding epitaxial growth and dopant selection set forth above are applicable to upper SD regions 810.

In determining the relative doping concentrations of lower SD region 210 and upper SD region 810, the nature of the VFET—pnp, or npn, as well as the MRAM orientation, standard or reversed connections, are considered. Selection of the relative doping concentrations and dopant type together with the design of the device upper and lower VFET SD region geometries enables the production of a device having high TMR while avoiding device material degradation issues resulting from high current and accompanying high device power during write processes.

Standard connected MRAM cells have asymmetric write currents. Such cells have a lower magnitude write "0" current than write "1" current. In one embodiment, the VFET includes upper SD region 810 configured and doped as the drain and lower SD region 210 configured and doped as the source to provide a forward bias. The relative upper and lower VFET SD regions geometries, overlaps and doping characteristics are adjusted such that the VFET forward current is smaller than the reverse current. The VFET resistance for the forward current is greater than that for the reverse current, thereby reducing the write "1" current of the device. The source SD 210 has a lower doping concentration than the upper SD region 810. Alternatively, the lower SD region 210 may be underlapped geometrically while the upper SD region 810 is overlapped to again provide a current bias. Lower spacer 410 and upper spacer 710 are altered to control the degree of underlapping or overlapping of the lower SD regions 210, and upper VFET SD regions 810. The current bias works in conjunction with the standard connected MRAM cell to reduce write currents and associated device power levels during write "1" cycles.

Figure 9:
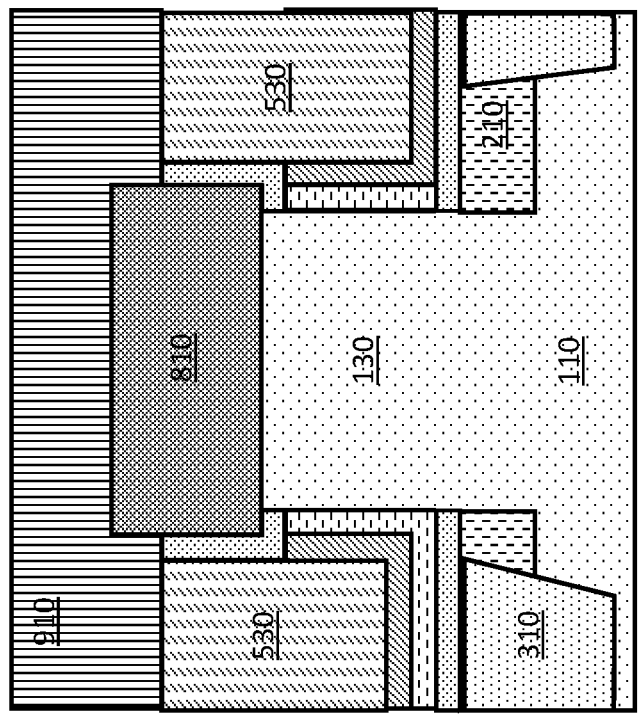
FIG. 9 provides a cross-sectional view of a step in the fabrication of a semiconductor device, according to an embodiment of the invention. The figure illustrates the device after the deposition and smoothing of an inter-layer dielectric material.
Figure 9:
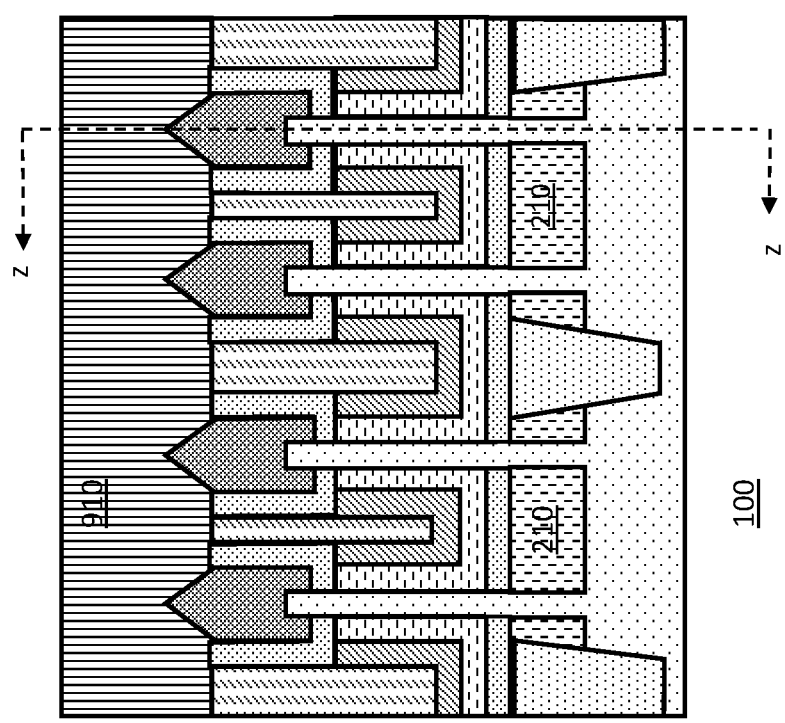

FIG. 9 illustrates device 100 after deposition of ILD2 layer 910. ILD2 layer 910, includes a dielectric material such as silicon oxide, silicon nitride, silicon oxynitride, or a combination thereof. Alternatively, ILD2 layer 910, may include a low-k dielectric material having a dielectric constant less than 3.9 (e.g., the dielectric constant of silicon oxide), and more specifically less than 2.5. Exemplary low-k dielectric materials include organosilicate glass (OSG) and SiLK®.

Figure 10:
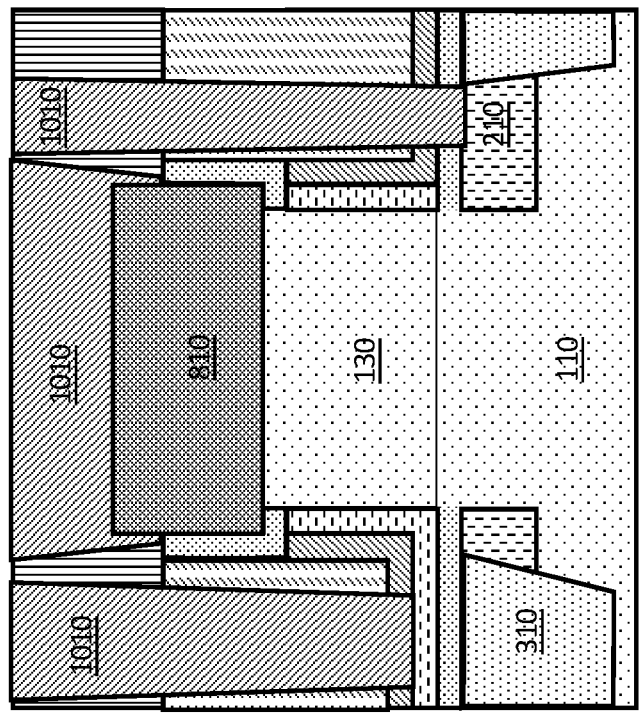
FIG. 10 provides a cross-sectional view of a step in the fabrication of a semiconductor device, according to an embodiment of the invention. The figure illustrates the device after the formation of device metal contacts.
Figure 10:
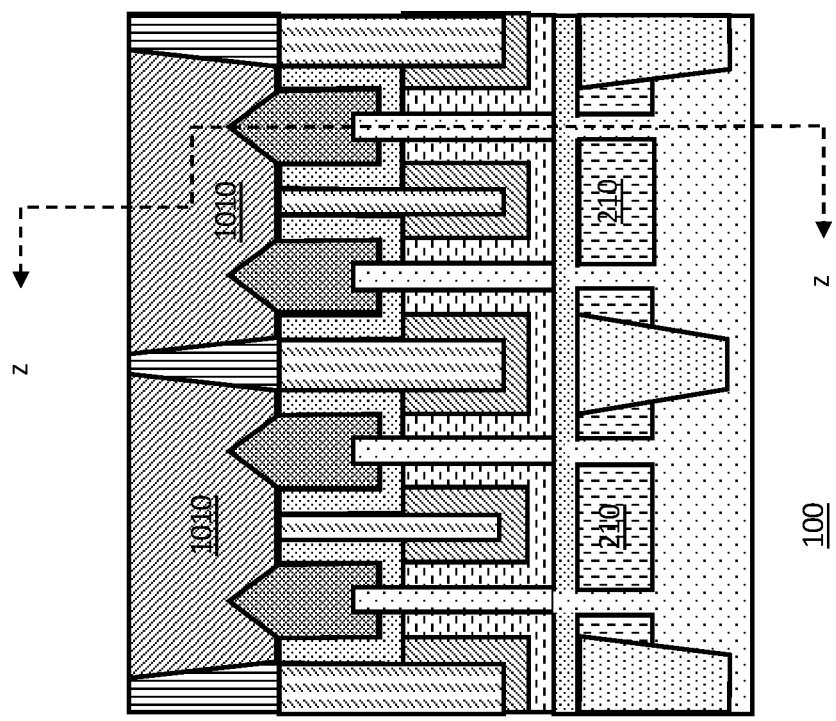

FIG. 10 illustrates device 100 after the etching and metallization of metal contact vias for the VFET SD and gate contacts 1010. The vias may be etched using RIE or ion beam etching (IBE). The VFET SD and gate contacts 1010 may be formed from any desired material using known CMOS deposition processes appropriate for the selected material. In an embodiment, a trench silicide process including the formation of a metal silicide in the vias followed by deposition of a metal, such as tungsten, occurs to create the VFET SD and gate contacts 1010. CMP process after formation of the VFET SD and gate contacts 1010 provides a smooth surface for the following fabrication steps.

Figure 11:
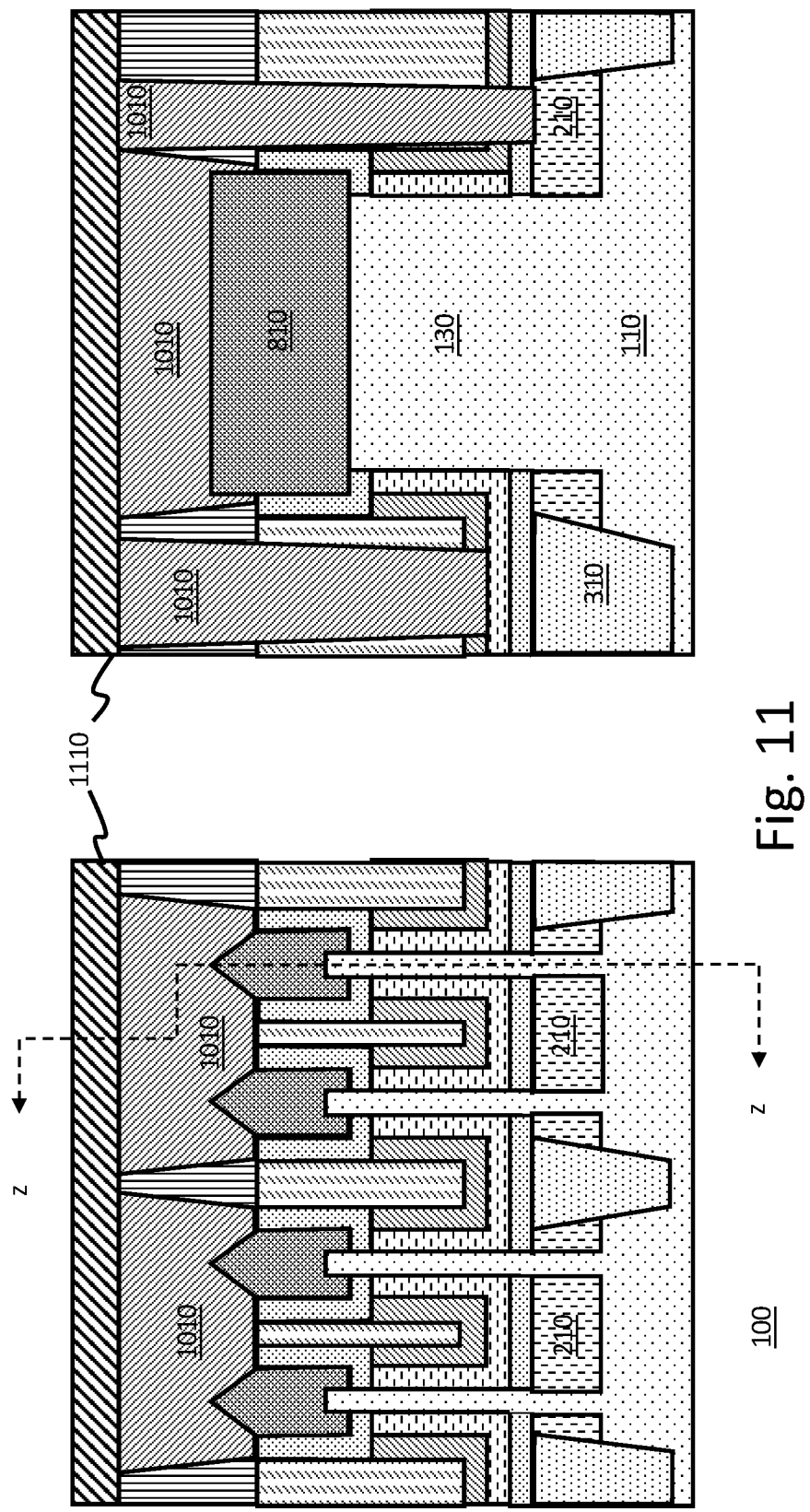
FIG. 11 provides a cross-sectional view of a step in the fabrication of a semiconductor device, according to an embodiment of the invention. The figure illustrates the device after the deposition of an inter-layer spacer.

FIG. 11 illustrates device 100 after deposition of a protective oxide layer1110, such as SiO. The protective oxide layer 1110 may be formed by suitable deposition processes, for example, CVD, PECVD, ALD, evaporation, PVD, chemical solution deposition, or other like processes.

Figure 12:
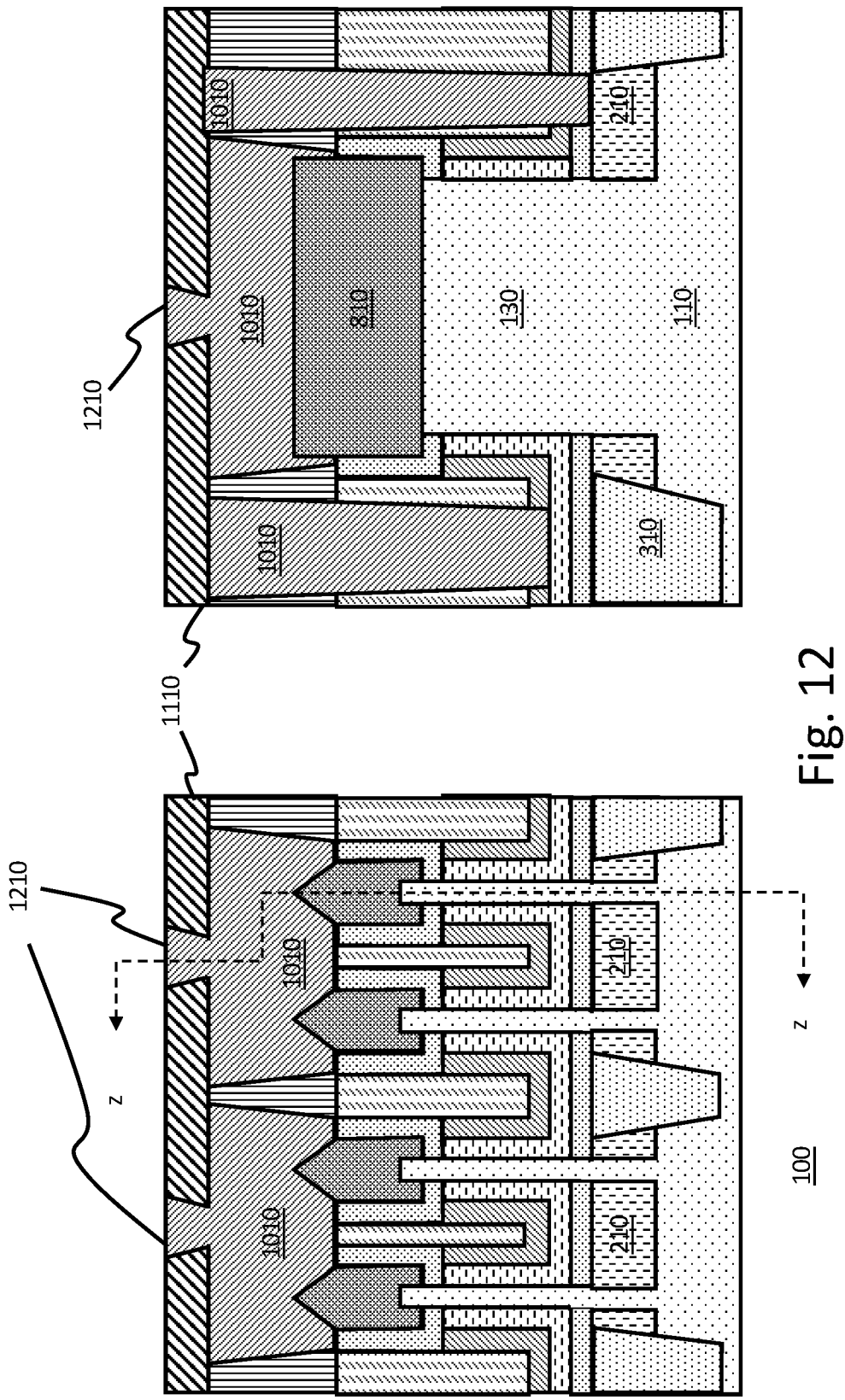
FIG. 12 provides a cross-sectional view of a step in the fabrication of a semiconductor device, according to an embodiment of the invention. The figure illustrates the device after the formation of upper VFET electrodes.

FIG. 12 illustrates device 100 after the formation of VFET upper MRAM contacts 1210 through oxide layer 1110. Formation of contacts 1210 includes lithographic masking and selective etching of protective oxide layer 1110 to form contact 1210 vias, followed by metallization processes using methods and materials similar to those used in the formation of SD and gate contacts 1010.

Figure 13:
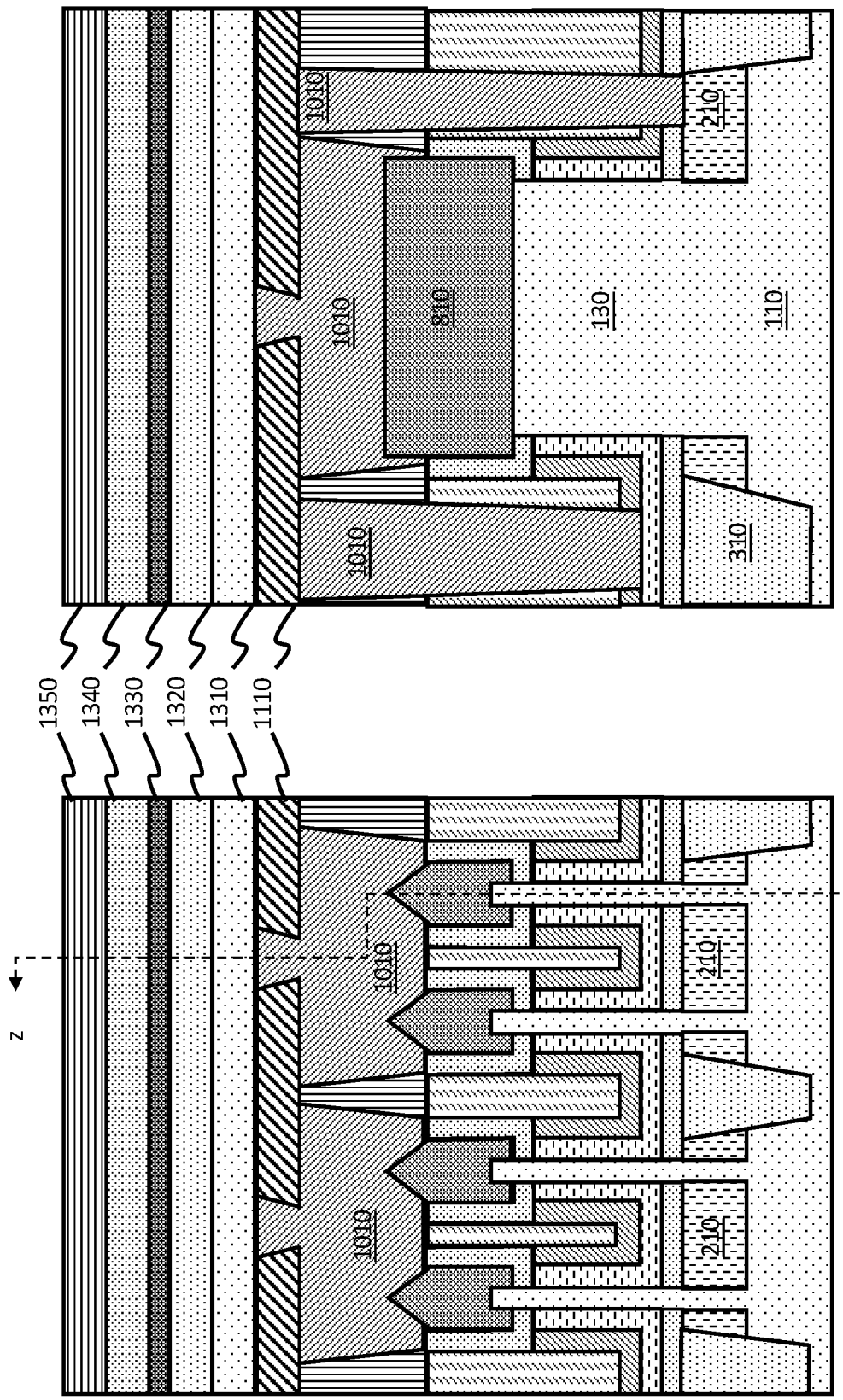
FIG. 13 provides a cross-sectional view of a step in the fabrication of a semiconductor device, according to an embodiment of the invention. The figure illustrates the device after the formation of MRAM layer stacks.

FIG. 13 illustrates device 100 after deposition of the layers of the MRAM cell stacks. As shown in the figure, the deposition includes a succession of layers deposited upon the protective oxide layer 1110 and the underlying VFET contact 1210 to form the vertical magnetic-tunnel junction (MTJ) stacks of the MRAM cells. In an embodiment, the illustrated MTJ stacks include a simplistically depicted MTJ made of a bottom electrode layer 1310, a reference magnetic layer 1320 (a layer having a fixed magnetic dipole moment), a tunnel barrier layer 1330, a free magnetic layer 1340 (a layer having a switchable magnetic dipole moment), and a top electrode layer 1350. Bottom electrode layer 1310 may include TaN or TiN deposited by CVD, PVD or similar methods. In an embodiment, bottom electrode 1310 in between about 1 nm and about 10 nm in thickness. The reference layer 1320 may include, for example one or more interfacial layers, or spacers, and ruthenium, cobalt, palladium, tantalum, iron, boron, cobalt-platinum (CoPt) or cobalt-palladium (CoPd), in multilayers or a mixture. In an embodiment, reference layer 1320 is between about 3 nm and about 10 nm in thickness. Next, a tunnel barrier layer 1330 is formed on reference layer 1320. The tunnel barrier layer 1330 may include a non-magnetic insulating material such as magnesium oxide (MgO). In an embodiment, tunnel barrier layer 1330 is between about 1 nm and about 3 nm in thickness. Following the formation of the tunnel barrier layer 1330, the free layer 1340 is formed on top of the tunnel barrier layer 1330. In this embodiment, the MTJ includes a seed layer (not shown) having free layer1340 grown thereon. The seed layer may include, for example, tantalum (Ta) or tantalum magnesium (TaMg) in some embodiments. The free layer 1340 may include cobalt-iron-boron (CoFeB), for example. Deposition of top electrode layer 1350 follows formation of free layer 1340. Top electrode layer 1350 may include TaN or TiN or similar materials. In an embodiment, top electrode layer 1350 is between about 1 nm and about 10 nm in thickness. The respective layers may be formed by CVD, PVD, or similar methods. The free layer 1340 and the reference layer 1320 have perpendicular magnetic anisotropy. In other embodiments, (shown in FIG. 19) the locations of the reference and free layers are reversed, yielding a reversed structure MRAM cell.

Figure 14:
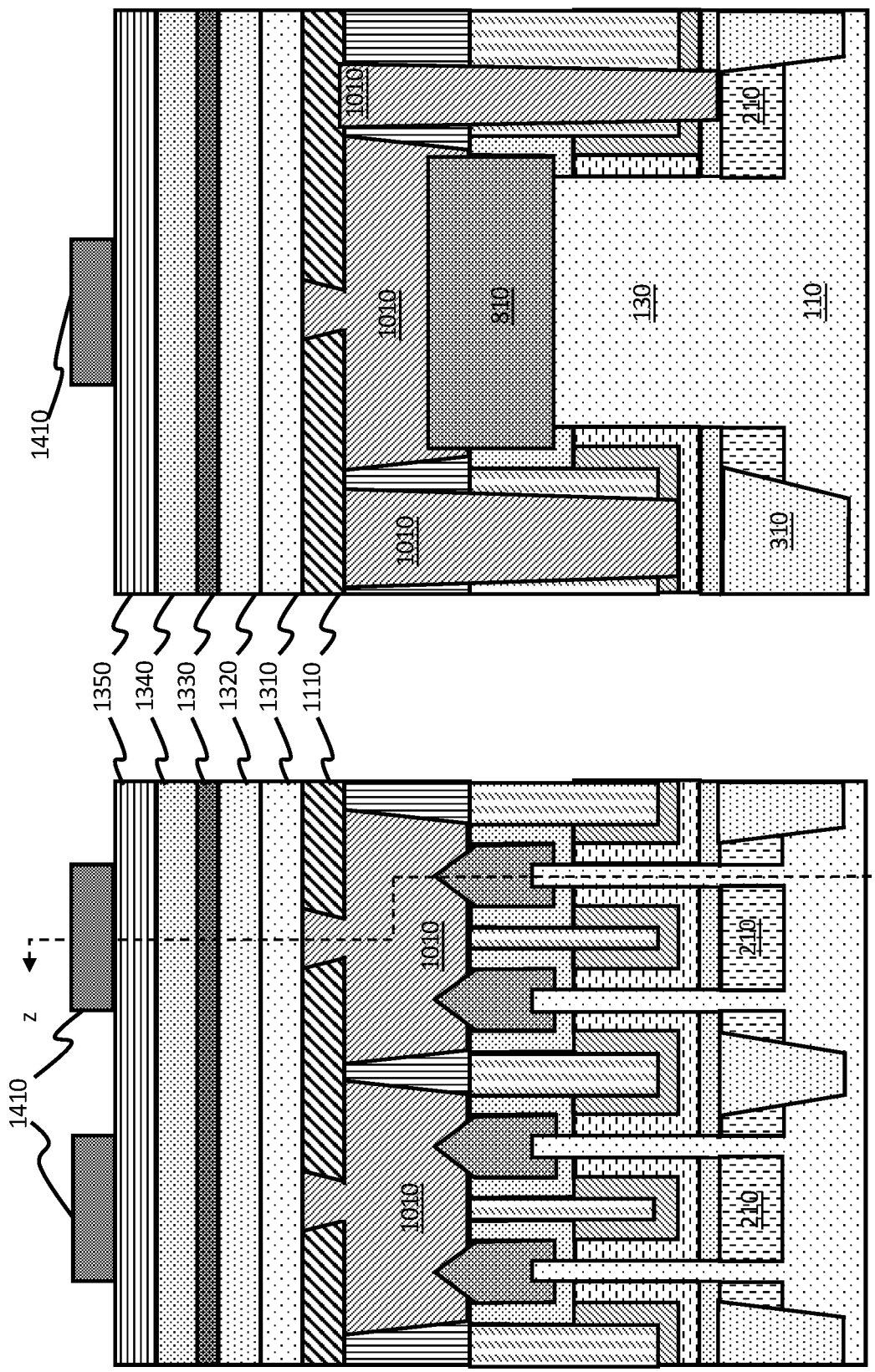
FIG. 14 provides a cross-sectional view of a step in the fabrication of a semiconductor device, according to an embodiment of the invention. The figure illustrates the device after the patterning and etching of an MRAM cell hard mask.

FIG. 14 illustrates device 100 after deposition, masking and selective etching of a hard mask 1410 for the MRAM cell stacks. In an embodiment, the hard mask 1410 consists of TaN or TiN deposited by CVD or PVD to a thickness of between about 20 nm and about 60 nm.

Figure 15:
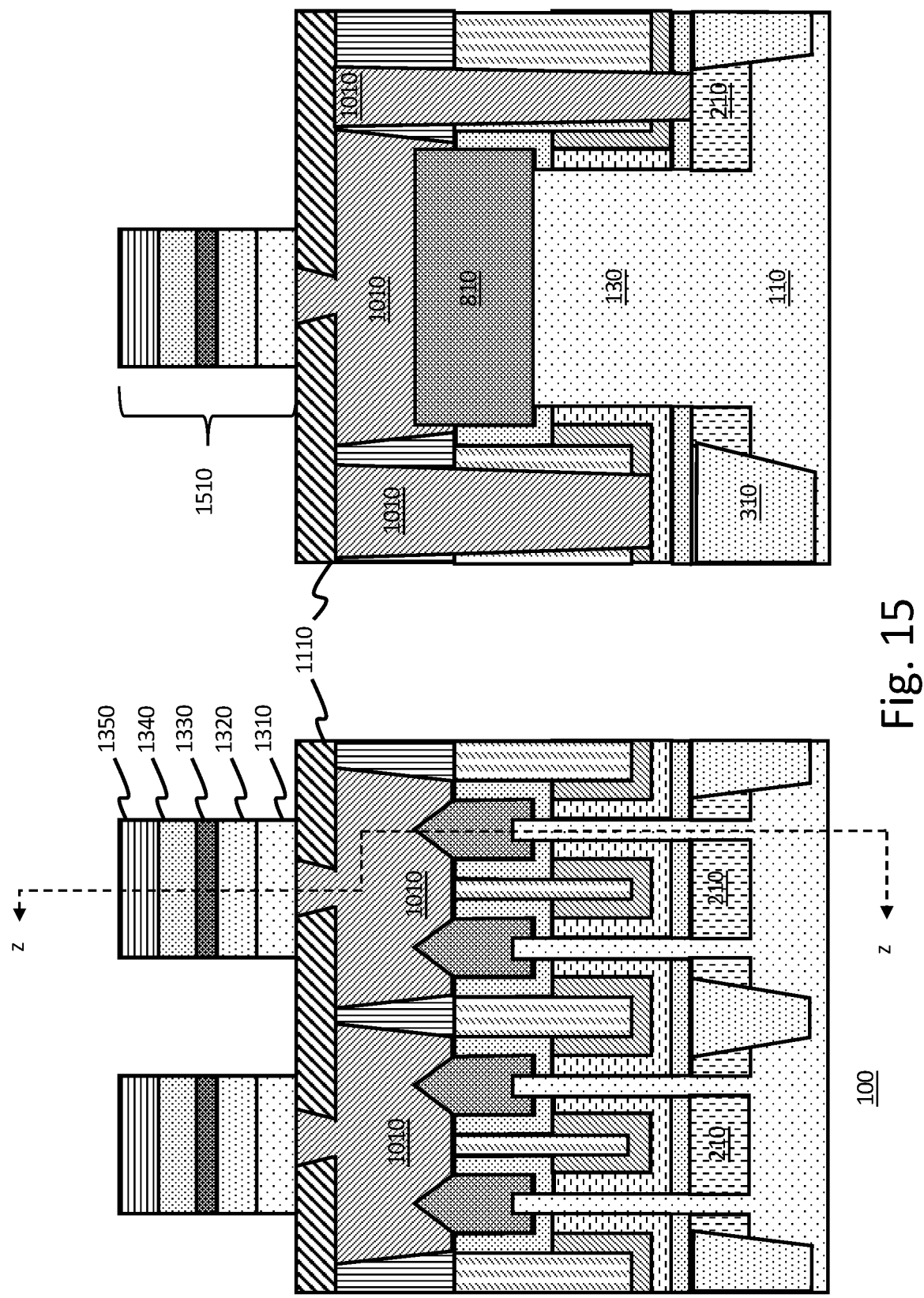
FIG. 15 provides a cross-sectional view of a step in the fabrication of a semiconductor device, according to an embodiment of the invention. The figure illustrates the device after the formation of discrete MRAM cell stacks.

FIG. 15 illustrates device 100 after formation of MRAM stacks 1510 by selective etching, by RIE or IBE, of MRAM stack layers, followed by removal of the hard mask 1410. In an embodiment, the MRAM cell stacks 1510 have a cross-sectional area of between about 80 nm$^2$, and about 2800 nm$^2$.

Figure 16:
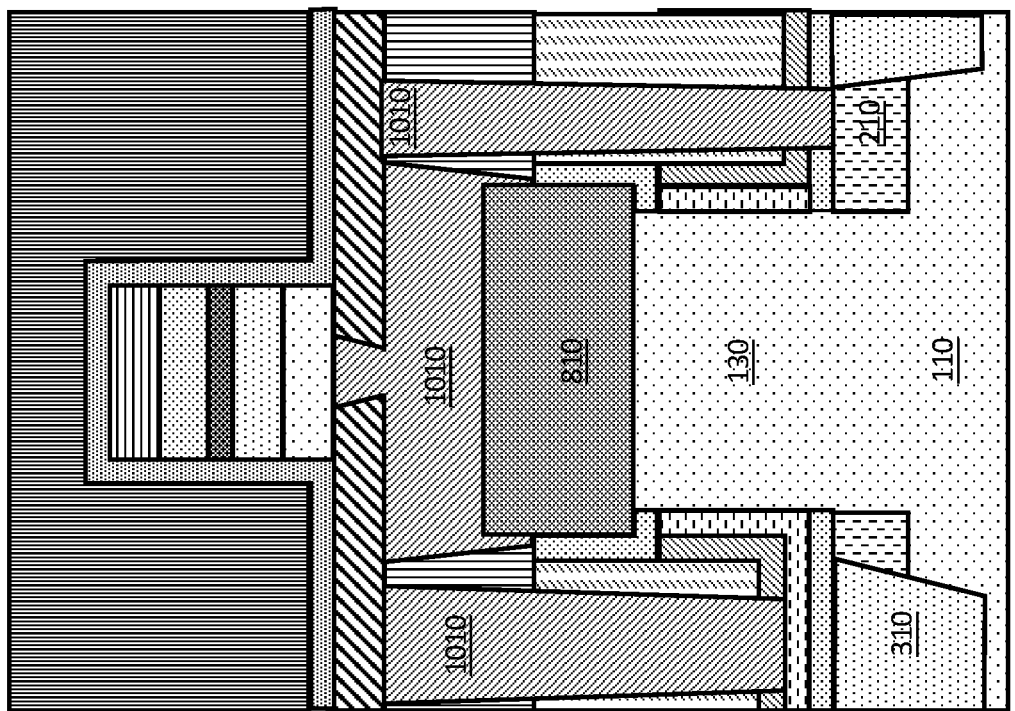
FIG. 16 provides a cross-sectional view of a step in the fabrication of a semiconductor device, according to an embodiment of the invention. The figure illustrates the device after the encapsulation and isolation of the discrete MRAM cell stacks.
Figure 16:
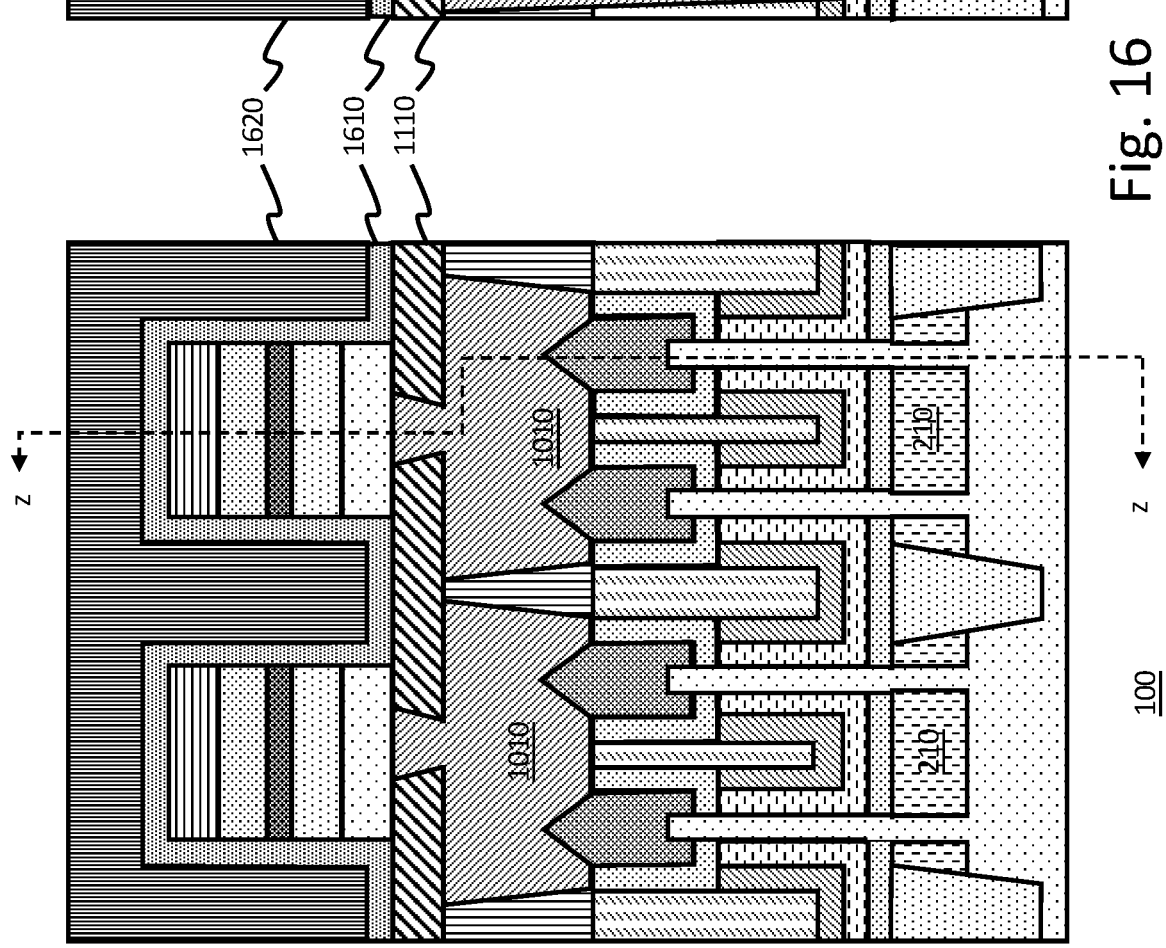

FIG. 16 illustrates device 100 after deposition of encapsulating dielectric material 1610 above and around MRAM cell stacks 1510, and deposition of ILD material 1620 above encapsulating dielectric material 1610. Encapsulating dielectric material 1610 may be deposited using any of the dielectric deposition methods set forth above. ILD material 1620 may be deposited as other ILD layer described above.

Figure 17:
FIG. 17 provides a cross-sectional view of a step in the fabrication of a semiconductor device, according to an embodiment of the invention. The figure illustrates the device after the formation of device metal contacts.

FIG. 17 illustrates device 100 after formation of MRAM and VFET SD metal contacts 1710. Metal contacts 1710 may be formed in a manner similar to the formation of SD and gate contacts 1010 described above. Additional device fabrication steps may be undertaken to complete the MRAM cells as either STT MRAM or SOT MRAM cells as desired.

Figure 18:
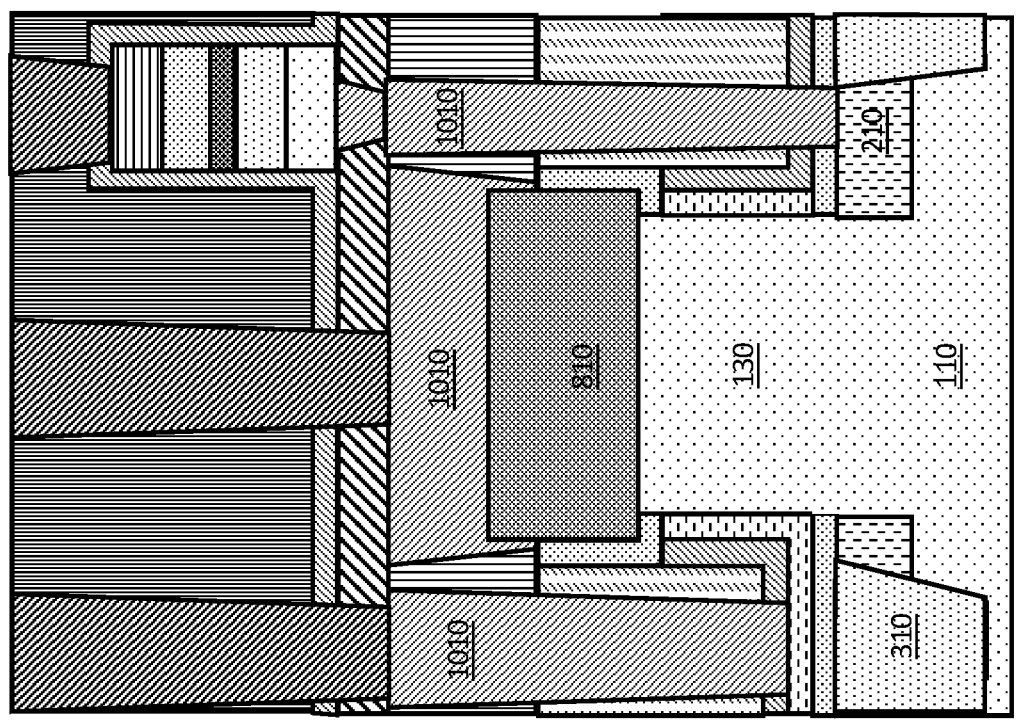
FIG. 18 provides a cross-sectional view of a step in the fabrication of a semiconductor device, according to an alternative embodiment of the invention. The figure illustrates the device after the formation of device metal contacts.

FIG. 18 illustrates an alternative structure, device 200, wherein MRAM cell stack 1510 is disposed above the lower VFET SD contact rather than the upper VFET SD contact, to provide alternative MRAM cell circuit design options.

Figure 19:
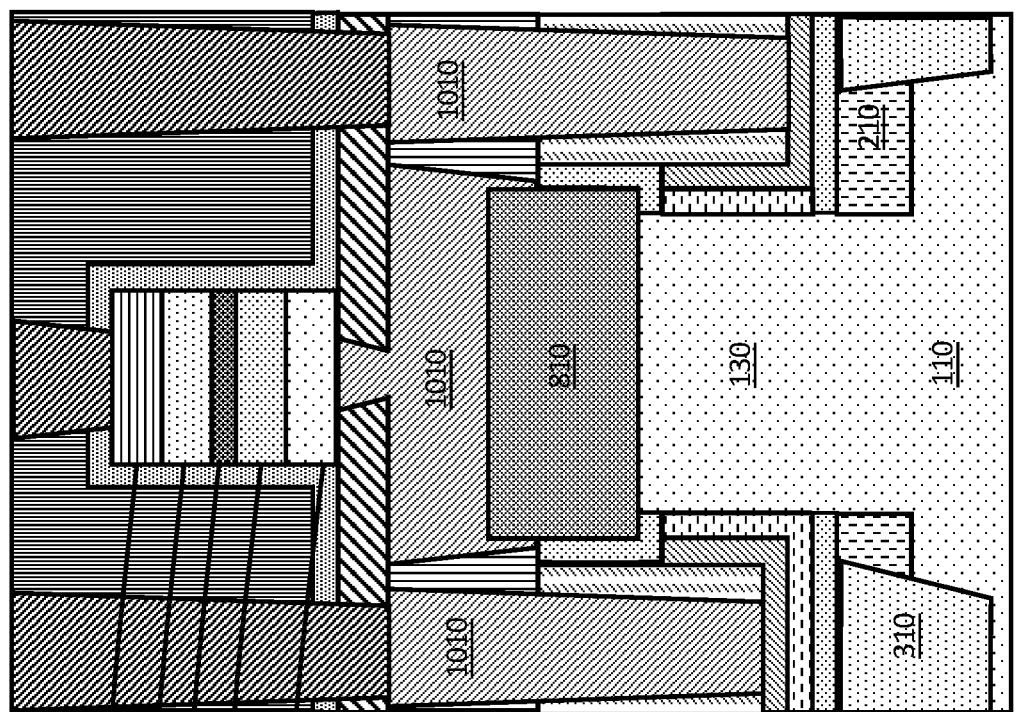
FIG. 19 provides a cross-sectional view of a step in the fabrication of semiconductor devices, according to alternative embodiments of the invention. The figure illustrates the devices after the formation of device metal contacts.
Figure 19:
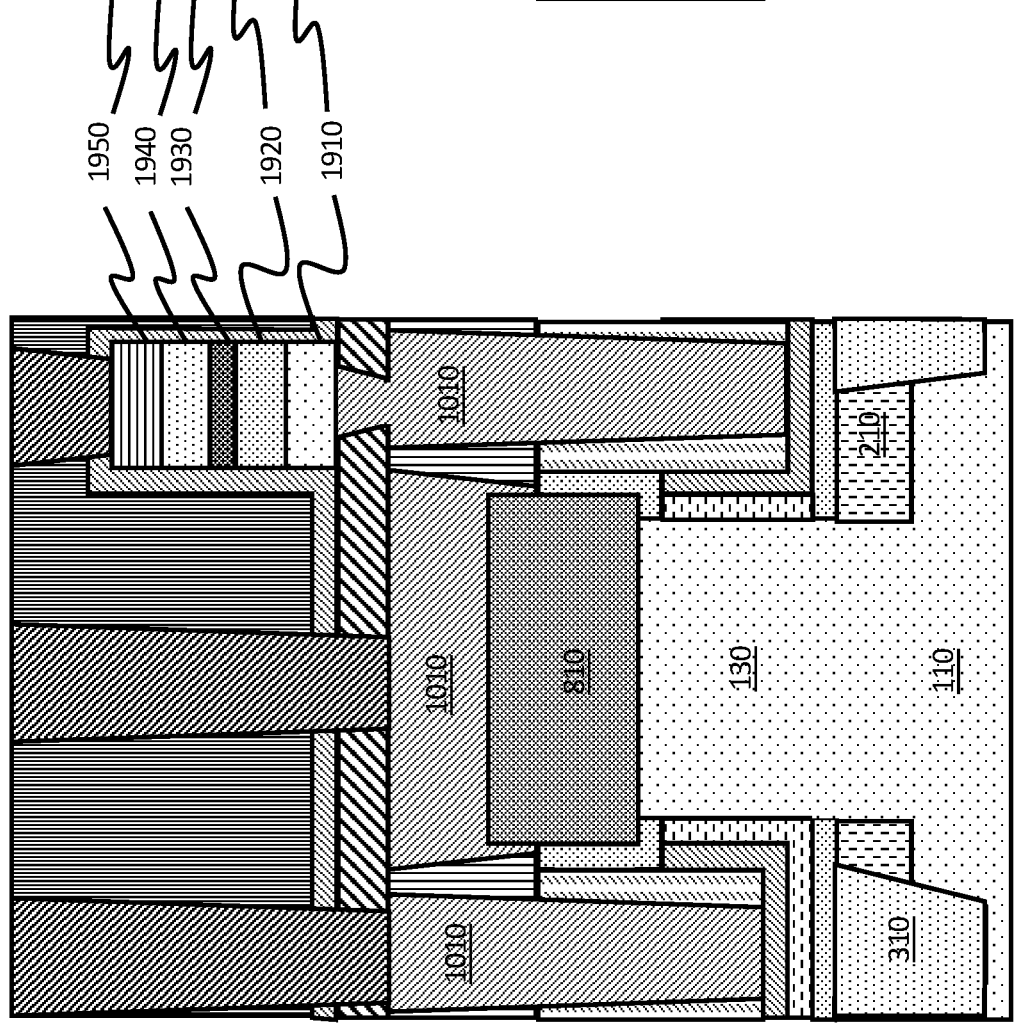

FIG. 19 illustrates alternative devices 300 and 400 having reversed MRAM cell stacks such that the MRAM cells have the structure: bottom electrode 1910 in electrical contact with the associated VFET, free layer 1920, tunnel barrier layer 1930, reference layer 1940, and top electrode 1950, to provide additional MRAM circuit design options.

Figure 20:
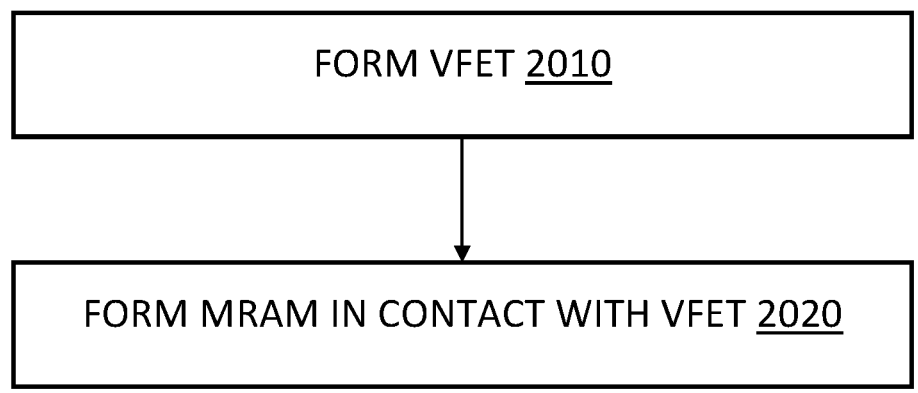
FIG. 20 provides a flowchart listing fabrication steps associated with the formation of devices according to one embodiment of the invention.

Flowchart 2000 of FIG. 20 depicts representative steps in the fabrication of devices according to an embodiment of the invention. As shown in the figure, at block 2010, a VFET is formed as part of an overall semiconductor device. In an embodiment, the formation of the VFET includes forming asymmetrical upper and lower VFET epitaxial source-drain regions to provide asymmetrical forward and reverse currents during MRAM write "0" and write "1" operations. At block 2020, an MRAM cell is formed in electrical communication with the VFET of block 2010, as part of the device. In an embodiment, an array of MRAM cells are formed in electrical contact with an associated array of VFETs. Embodiments of the invention include formation of standard MRAM cells having a bottom electrode, reference layer, tunnel barrier, free layer and top electrode, as well as reversed MRAM cells having a bottom electrode, free layer, tunnel barrier, reference layer and top electrode. The MRAM cells may be formed in electrical contact with either the upper or lower SD contact of the VFET. The MRAM cells may be formed as either spin-transfer torque MRAM cells or spin-orbit torque MRAM cells by further device fabrication steps.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
    a VFET (vertical field effect transistor) comprising a lower source/drain (S/D) region and an upper S/D region disposed above the lower S/D region, wherein the lower S/D region comprises a lower dopant concentration than the upper S/D region, a fin formed upon a substrate, the upper source-drain region disposed in contact with an upper surface of the fin, and the lower source-drain region disposed adjacent to a side of VFET channel fin; and
    an MRAM (magnetoresistive random-access memory) cell disposed above the upper S/D region and in electrical contact with the VFET.

2. The semiconductor device according to claim 1, further comprising an upper VFET electrode, in electrical communication with the MRAM, wherein the upper VFET electrode comprises a horizontal critical dimension less than a horizontal critical of the MRAM.

3. The semiconductor device according to claim 1, wherein the VFET comprises geometrically asymmetrical source and drain regions.

4. The semiconductor device according to claim 1, wherein the MRAM is disposed in electrical communication with the upper source-drain region of the VFET.

5. The semiconductor device according to claim 1, wherein the MRAM is disposed in electrical communication with the lower source-drain region of the VFET.

6. The semiconductor device according to claim 1, wherein the MRAM comprises an SOT MRAM (spin-orbit torque magnetoresistive random-access memory).

7. The semiconductor device according to claim 1, wherein the MRAM comprises an STT MRAM (spin transfer torque magnetoresistive random-access memory).

8. The semiconductor device according to claim 1, wherein the MRAM comprises a bottom electrode, reference layer, tunnel barrier layer free layer top electrode stack.

9. The semiconductor device according to claim 1, wherein the MRAM comprises a bottom electrode, free layer, tunnel barrier layer, reference layer, top electrode stack.

10. A semiconductor device comprising:
    a VFET (vertical field effect transistor comprising a lower source/drain (S/D) region and an upper S/D region disposed above the lower S/D region, wherein the lower S/D region comprises a lower dopant concentration than the upper S/D region, a fin formed upon a substrate, an upper source-drain region disposed in contact with an upper surface of the fin, and a lower source-drain region disposed adjacent to a side surface of VFET channel fin;
    a MRAM (magnetoresistive random-access memory) cell disposed above the upper S/D region and in electrical communication with the VFET; and
    an upper VFET electrode, in electrical communication with the MRAM, wherein the upper VFET electrode comprises a horizontal critical dimension less than a horizontal critical dimension of the MRAM.

11. The semiconductor device according to claim 10, wherein the VFET comprises geometrically asymmetrical upper and lower source drain regions.

12. A method of fabricating a semiconductor device, the method comprising:
    fabricating a VFET (vertical field effect transistor) as part of a device, comprising a lower source/drain (S/D) region and an upper S/D region disposed above the lower S/D region, wherein the lower S/D region comprises a lower dopant concentration than the upper S/D region, a fin formed upon a substrate, an upper source-drain region disposed in contact with an upper surface of the fin, and a lower source-drain region disposed adjacent to a side of VFET channel fin; and
    fabricating an MRAM (magnetoresistive random-access memory) cell above the upper S/D region and in electrical contact with the VFET.

13. The method of fabricating a semiconductor device according to claim 12, further comprising fabricating an upper VFET electrode having a horizontal critical dimension less than a horizontal critical dimension of the MRAM.

14. The method of fabricating a semiconductor device according to claim 12, wherein the VFET comprises geometrically asymmetrical upper and lower source drain regions.

15. The method of fabricating a semiconductor device according to claim 12, wherein the MRAM cell is fabricated in electrical communication with the upper source drain region.

16. The method of fabricating a semiconductor device according to claim 12, wherein the MRAM cell is fabricated in electrical communication with the lower source drain region.

17. The method of fabricating a semiconductor device according to claim 12, wherein the VFET comprises an upper source-drain region disposed directly above a VFET channel fin, and a lower source-drain region disposed adjacent to the VFET channel fin.

* * * * *